United States Patent
Sun et al.

(10) Patent No.: US 12,383,879 B2
(45) Date of Patent: Aug. 12, 2025

(54) SEMICONDUCTOR PHOSPHIDE INJECTION SYNTHESIS SYSTEM AND CONTROL METHOD

(71) Applicant: THE 13TH RESEARCH INSTITUTE OF CHINA ELECTRONICS TECHNOLOGY GROUP CORPORATION, Hebei (CN)

(72) Inventors: Niefeng Sun, Hebei (CN); Shujie Wang, Hebei (CN); Huisheng Liu, Hebei (CN); Tongnian Sun, Hebei (CN)

(73) Assignee: THE 13TH RESEARCH INSTITUTE OF CHINA ELECTRONICS TECHNOLOGY GROUP CORPORATION, Shijiazhuang (CN)

( * ) Notice: Subject to any disclaimer, the term of this patent is extended or adjusted under 35 U.S.C. 154(b) by 578 days.

(21) Appl. No.: 17/797,081

(22) PCT Filed: Jul. 5, 2021

(86) PCT No.: PCT/CN2021/104407
§ 371 (c)(1),
(2) Date: Aug. 2, 2022

(87) PCT Pub. No.: WO2022/134527
PCT Pub. Date: Jun. 30, 2022

(65) Prior Publication Data
US 2023/0049408 A1    Feb. 16, 2023

(30) Foreign Application Priority Data

Dec. 23, 2020 (CN) .......................... 202011543426.3
Dec. 23, 2020 (CN) .......................... 202023142510.2

(51) Int. Cl.
*B01J 10/00* (2006.01)
*B01J 6/00* (2006.01)
(Continued)

(52) U.S. Cl.
CPC ............. *B01J 10/005* (2013.01); *B01J 6/007* (2013.01); *C01B 25/087* (2013.01); *G01K 7/02* (2013.01); *C01P 2006/40* (2013.01)

(58) Field of Classification Search
CPC .. B01J 6/00; B01J 6/007; B01J 10/005; C01B 25/087; C30B 11/002; C30B 11/003; C30B 11/007
See application file for complete search history.

(56) References Cited

U.S. PATENT DOCUMENTS 3,933,435 A * 1/1976 Menashi ................. C30B 29/44
432/262

\* cited by examiner

*Primary Examiner* — Lessanework Seifu
(74) *Attorney, Agent, or Firm* — Enable IP, P.C.

(57) ABSTRACT

A semiconductor phosphide injection synthesis system and a control method are provided, which belong to the technical field of preparation of semiconductor phosphides. The semiconductor phosphide injection synthesis system includes a furnace body, a shielding carrier box arranged above the furnace body by virtue of a lifting mechanism, a phosphorus source carrier arranged in the shielding carrier box, an injection pipe arranged below the phosphorus source carrier, and a crucible arranged at an inner bottom of the furnace body in a matched manner. The phosphorus source carrier includes a phosphorus source carrier main body, a phosphorus source carrier upper cover, a heating element base arranged at an inner bottom of the phosphorus source carrier main body, and a heating element arranged on the heating element base; a heat insulation layer is wrapped on an outer wall of the phosphorus source carrier; and an induction coil is arranged between the heat insulation layer and an inner (Continued)

wall of the shielding carrier box. By improving a device and method, the system stability can be improved, and an entire synthesis system achieves quantitative synthesis, which lowers the risk of explosion of the phosphorus source carrier.

5 Claims, 3 Drawing Sheets

(51) Int. Cl.
*C01B 25/08* (2006.01)
*G01K 7/02* (2021.01)

SEMICONDUCTOR PHOSPHIDE INJECTION SYNTHESIS SYSTEM AND CONTROL METHOD

TECHNICAL FIELD

The present invention belongs to the technical field of preparation of semiconductor phosphides, specifically to a semiconductor phosphide injection synthesis system and a control method.

BACKGROUND ART

Semiconductor phosphides mainly include indium phosphide, gallium phosphide, and other semiconductor materials. An indium phosphide (InP) device has the characteristics of high frequency, high speed, irradiation resistance, low noise, and the like. Its operating frequency reaches 3 THz. When the operating frequency of the device is greater than 100 GHz, the InP demonstrates outstanding advantages. The InP has become a key semiconductor material of ultra-high-frequency and ultra-high-speed devices, and optoelectronic devices. With the development of terahertz, millimeter wave, optical communication, autonomous driving, Internet of things, and 5G/6G technologies in the future, the InP will play a greater role and achieve greater social benefits. A phosphide is extremely difficult to prepare since it has an extremely high saturated vapor pressure at its melting point.

Synthesis methods for a phosphide mainly include horizontal diffusion synthesis and injection synthesis. Generally, the horizontal diffusion synthesis technology is simple, but has long synthesis cycle and low material purity, so it is hard to obtain a high-quality polycrystalline material. The phosphide injection synthesis technology is an excellent method for preparing polycrystals, which has the characteristics of high synthesis rate and high purity of a prepared material and has the disadvantage that in order to ensure the utilization rate of phosphorus, the injection synthesis rate is often required to be extremely low, so a phenomenon of explosion of a phosphorus source carrier is prone to occur. When the synthesis amount increases, the mass of red phosphorus in a phosphorus source carrier increases; it is difficult to achieve uniform heating of the red phosphorus. The thermal response capacity of a system is low, and the temperature control capacity of the system is low, so the risk of explosion of the phosphorus source carrier is increased. A polycrystalline material is the basis for preparing a single crystal material. Therefore, an injection synthesis device with high synthesis purity, high synthesis efficiency and high phosphorus utilization rate is urgently needed.

SUMMARY OF THE INVENTION

The technical problem to be solved by the present invention is to provide a semiconductor phosphide injection synthesis system and a control method. By improving a device and method, the system stability can be improved, and an entire synthesis system achieves quantitative synthesis, which lowers the risk of explosion of a phosphorus source carrier.

A technical solution adopted in the present invention: A semiconductor phosphide injection synthesis system includes a furnace body, a shielding carrier box arranged above the furnace body by virtue of a lifting mechanism, a phosphorus source carrier arranged in the shielding carrier box, an injection pipe arranged below the phosphorus source carrier, and a crucible arranged at an inner bottom of the furnace body in a matched manner. The phosphorus source carrier includes a phosphorus source carrier main body, a phosphorus source carrier upper cover, a heating element base arranged at an inner bottom of the phosphorus source carrier main body, and a heating element arranged on the heating element base; a heat insulation layer is wrapped on an outer wall of the phosphorus source carrier; and an induction coil is arranged between the heat insulation layer and an inner wall of the shielding carrier box.

A control method implemented on the basis of the semiconductor phosphide injection synthesis system includes the following steps:

step I, respectively loading red phosphorus and high-purity indium into the phosphorus source carrier and the crucible; then covering the high-purity indium with a boron oxide covering agent; vacuumizing the furnace body through a vent of the furnace body; and filling the furnace body with inert gas to complete the preparatory work;

step II, heating the crucible by means of a main resistive heater to melt the high-purity indium into a melt;

step III, heating a pressure measurement system by using an auxiliary heater; observing a solid boron oxide column through an observation window a, and recording a display temperature T1 of a thermocouple a and a scale value L1 on a scale after melting; calculating, according to a diameter of a pressure-equalizing pipe, an upper remaining space volume V1 of the pressure-equalizing pipe; and obtaining, according to a gas pressure formula, a value of pressure intensity P1 of gas in the pressure-equalizing pipe at the time;

step IV, lowering the phosphorus source carrier towards the melt by using the lifting mechanism until the injection pipe is close to a position from the bottom of the crucible and at the same time, a thermocouple b also enters an insertion slot;

step V, electrifying the induction coil; observing bubbling of the injection pipe through the observation window b; recording a display temperature T2 of the thermocouple a and a scale value L2 on the scale when bubbling starts; calculating, according to the diameter of the pressure-equalizing pipe, an upper remaining space volume V2 of the pressure-equalizing pipe;

and obtaining, according to a formula $P1V1/T1=P2V2/T2$, a value of pressure intensity P2 of the gas in the pressure-equalizing pipe at the time;

step VI, keeping $\Delta P$ between 0.05 Pe and 0.1 Pe according to a pressure difference formula $\Delta P = P2 - P0$, so as to control the bubbling rate of the injection pipe, where P0 represents a numerical value of a pressure gauge, and Pe represents a saturated vapor pressure at the melting point;

a method for controlling the bubbling rate of the injection pipe including:

adjusting, according to a display temperature feedback of the thermocouple b, a temperature in the phosphorus source carrier by adjusting the magnitude of a current of the induction coil in real time, thus ensuring that P2 in the phosphorus source carrier is constant, and accordingly achieving a constant bubbling rate of the injection pipe; and step VII, after the synthesis is completed, powering off the induction coil and the auxiliary heater, and resetting the phosphorus source carrier to force the injection pipe to be separated from the boron oxide covering agent.

Beneficial effects achieved by the present invention are as follows: By use of the induction coil, a plurality of heating elements in the phosphorus source carrier generate heat to heat the red phosphorus, so that the red phosphorus is heated uniformly and is volatilized and injected into the melt; at the same time, a pressure and temperature measurement and balance system is arranged on the phosphorus source carrier and is used for measuring, in combination with the saturated vapor pressure of the phosphorus, a pressure and temperature inside the synthesis system with a corrosive atmosphere and an induction magnetic field, so that the entire synthesis system is monitorable and controllable. The device is particularly applicable to high-capacity synthesis; and the heating uniformity of the synthesis system can be improved, and the stability can be improved, so that the entire synthesis system achieves quantitative synthesis, and the risk of explosion of the phosphorus source carrier is lowered.

DETAILED DESCRIPTION OF THE INVENTION

Figure 1:
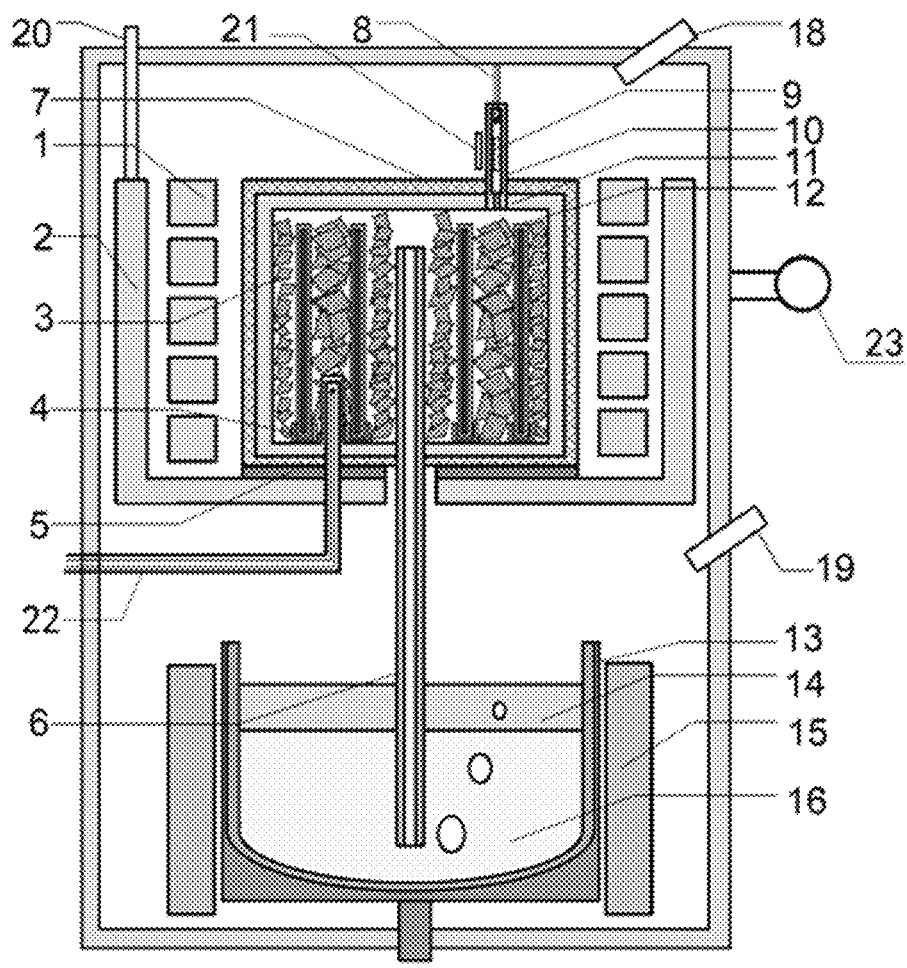
FIG. 1 is a schematic structural diagram of the present invention.
Figure 2:
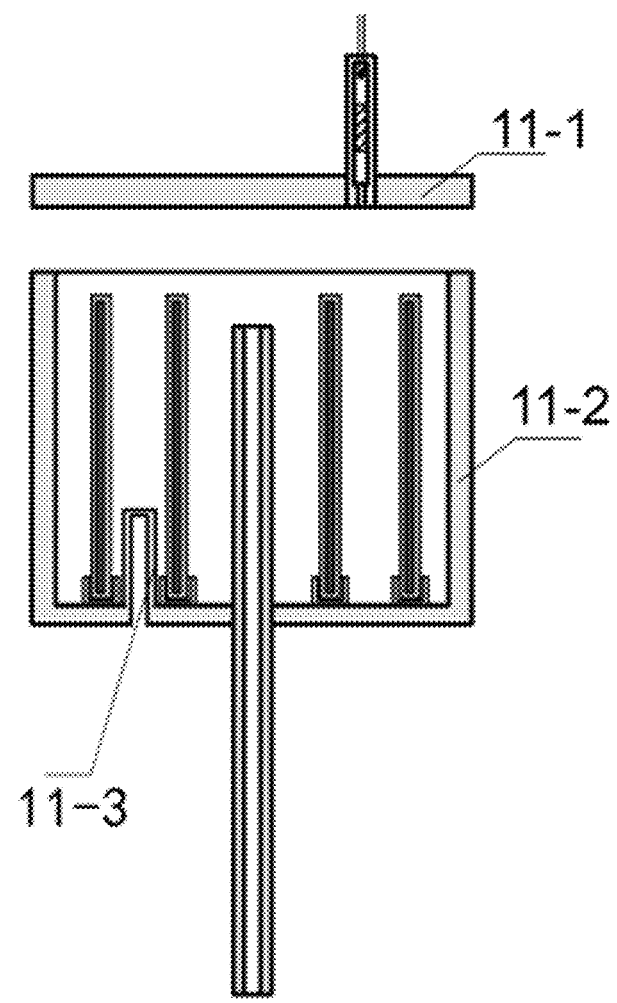
FIG. 2 is a schematic structural diagram of a phosphorus source carrier.
Figure 3:
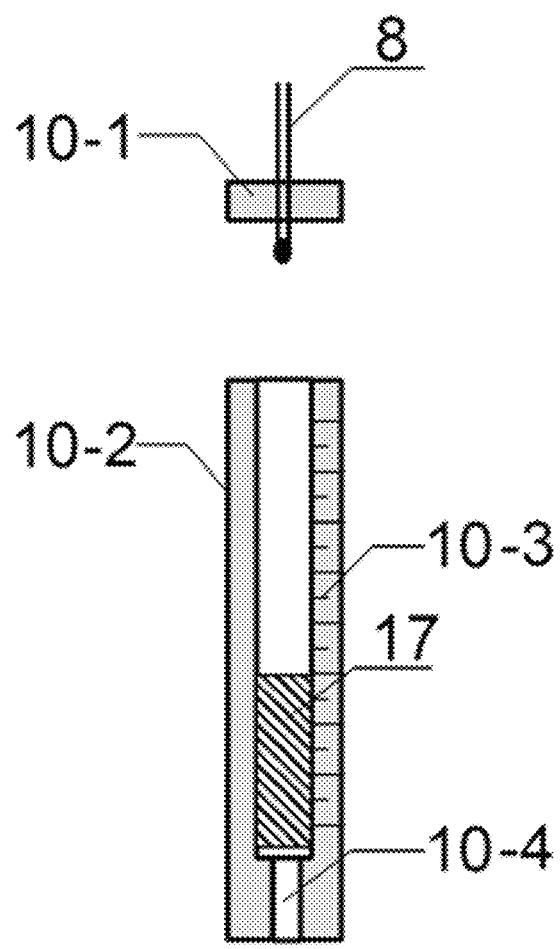
FIG. 3 is a schematic structural diagram of a pressure measurement system.

Referring to FIGS. 1-3, semiconductor phosphide injection synthesis system includes a furnace body, a shielding carrier box 2 arranged above the furnace body by virtue of a lifting mechanism 20, a phosphorus source carrier 11 arranged in the shielding carrier box 2, an injection pipe 6 arranged below the phosphorus source carrier 11, and a crucible 13 arranged at an inner bottom of the furnace body in a matched manner. The phosphorus source carrier 11 includes a phosphorus source carrier main body 11-2, a phosphorus source carrier upper cover 11-1, a heating element base 4 arranged at an inner bottom of the phosphorus source carrier main body 11-2, and a heating element 12 arranged on the heating element base 4; a heat insulation layer 7 is wrapped on an outer wall of the phosphorus source carrier 11; and an induction coil 1 is arranged between the heat insulation layer 7 and an inner wall of the shielding carrier box 2. A pressure gauge 23 is also arranged on an outer side of the furnace body.

A pressure measurement system is arranged on the phosphorus source carrier upper cover 11-1; the pressure measurement system includes a pressure-equalizing pipe 10-2 welded to the phosphorus source carrier upper cover 11-1, a solid boron oxide column 17 arranged in the pressure-equalizing pipe 10-2, a pressure measurement sealing cap 10-1 with a thermocouple a8, and an auxiliary heater 21 arranged on an outer wall of the pressure-equalizing pipe 10-2; the pressure measurement sealing cap 10-1 is welded to an upper end of the pressure-equalizing pipe 10-2; a lower end of the pressure-equalizing pipe 10-2 is provided with an air inlet hole 10-4 communicated with the phosphorus source carrier 11; an observation scale 10-3 is arranged on the pressure-equalizing pipe 10-2; and an upper end surface of the furnace body is provided with an observation window a18.

A thermocouple wire of the thermocouple a8 is connected to a sensor on the outer side of the furnace body.

A bottom of the phosphorus source carrier main body 11-2 is provided with an insertion slot 11-3 for accommodating a thermocouple b22; the thermocouple b22 is "⌐"-shaped, an upper end of which is arranged in the insertion slot 11-3 and a left side of which is connected to the furnace body.

An outer wall of the crucible 13 is provided with a main resistive heater 15 in a surrounding manner, and an observation window b19 matched with the crucible 13 is arranged in the middle of the furnace body.

A control method of the semiconductor phosphide injection synthesis system includes the following steps:

step I, red phosphorus 3 and high-purity indium are respectively loaded into the phosphorus source carrier 11 and the crucible 13; the high-purity indium is then covered with a boron oxide covering agent 14; and the furnace body is vacuumized through a vent of the furnace body and is filled with inert gas to complete the preparatory work;

step II, the crucible 13 is heated by means of the main resistive heater 15 to melt the high-purity indium into a melt;

step III, the auxiliary heater 21 is used to heat the pressure measurement system 10; a solid boron oxide column 17 is observed through the observation window a18, and a display temperature T1 of the thermocouple a8 and a scale value L1 on the scale 10-3 after melting are recorded; an upper remaining space volume V1 of the pressure-equalizing pipe 10-2 is calculated according to a diameter of the pressure-equalizing pipe 10-2; and a value of pressure intensity P1 of gas in the pressure-equalizing pipe 10-2 at this time is obtained according to a gas pressure formula;

step IV, the phosphorus source carrier 11 is lowered towards the melt by using the lifting mechanism 20 until the injection pipe 6 is close to a position from the bottom of the crucible and at the same time, the thermocouple b22 also enters the insertion slot 11-3;

step V, the induction coil 1 is electrified; bubbling of the injection pipe 6 is observed through the observation window b19; a display temperature T2 of the thermocouple a8 and a scale value L2 on the scale 10-3 when bubbling starts are recorded; an upper remaining space volume V2 of the pressure-equalizing pipe 10-2 is calculated according to the diameter of the pressure-equalizing pipe 10-2; and a value of pressure intensity P2 of the gas in the pressure-equalizing pipe 10-2 at this time is obtained according to a formula $P1V1/T1=P2V2/T2$;

step VI, $\Delta P$ is kept between 0.05 Pe and 0.1 Pe according to a pressure difference formula $\Delta P=P=P2-P0$, so as to control the bubbling rate of the injection pipe 6, where P0 represents a numerical value of the pressure gauge 23, and Pe represents a saturated vapor pressure at the melting point;

a method for controlling the bubbling rate of the injection pipe 6 including: adjusting, according to a display temperature feedback of the thermocouple b22, a temperature in the phosphorus source carrier 11 by adjusting the magnitude of a current of the induction coil 1 in real time, thus ensuring that P2 in the phosphorus source carrier 11 is constant, and accordingly realizing a constant bubbling rate of the injection pipe 6; and step VII, after the synthesis is completed, the induction coil 1 and the auxiliary heater 21 are powered off, and the phosphorus source carrier 11 is reset to force the injection pipe 6 to be separated from the boron oxide covering agent 14.

During specific implementation, the thermocouple a8 and the pressure measurement sealing cap 10-1 are welded together, and at the same time, two thermocouple wires are in no contact. The pressure-equalizing pipe 10-2 and the phosphorus source carrier upper cover 11-1 are welded together. The solid boron oxide column 17 is put into the pressure-equalizing pipe 10-2. The pressure measurement sealing cap 10-1 with the thermocouple a8, and the pressure-equalizing pipe 10-2 are welded together The heating element 12 is loaded on the heating element base 4 inside the phosphorus source carrier main body 11-2. The red phosphorus 3 is then loaded into the phosphorus source carrier main body 11-2 according to desired synthesis mass, and the phosphorus source carrier upper cover 11-1 and the phosphorus source carrier main body 11-2 are welded together.

The induction coil 1 is then put into the shielding carrier box 2. Meanwhile, the heat insulation layer 7 is wrapped on an outer wall of the phosphorus source carrier 11, and the phosphorus source carrier 11 wrapped with the heat insulation layer 7 is put into the induction coil 1.

The thermocouple wire of the thermocouple a8 is connected to the sensor on the outer side of the furnace body. The observation window a18 and the observation window b19 are mounted on the furnace body.

The high-purity indium and the boron oxide covering agent 14 are put into the crucible 13, and the system is vacuumized to 10-5 Pa and is filled with the inert gas. The crucible 13 is heated through the main resistive heater 15, so that the high-purity indium and the boron oxide covering agent 14 are melted, and the high-purity indium becomes a melt 16.

The auxiliary heater 21 is used to heat the pressure measurement system, which is observed through the observation window a18 until the solid boron oxide column 17 is melted; after the thermocouple a8 is stabilized, the temperature T1 and the scale value L1 on the scale 10-3 at this time are recorded. The volume V1 at this time is calculated according to the diameter of the pressure-equalizing pipe 10-2. At this time, internal and external pressures are equalized, and the system pressure is P1.

The phosphorus source carrier 11 is then lowered towards the melt 16 by using the lifting mechanism 20, and the thermocouple b23 is inserted into the insertion slot 11-3 until the injection pipe 6 is close to a position that is 3-5 mm above the bottom of the crucible.

An alternating current is made to the induction coil 1, and the bubbling of the injection pipe 6 is observed through the observation window b19. Moreover, the scale value L2 on the scale 10-3 is observed, and the temperature T2 at this time is recorded, thus obtaining the volume V2 at this time. The pressure P2 in the phosphorus source carrier at this moment is obtained. The P2 value is obtained according to the Clapeyron equation P1V1/T1=P2V2/T2. The bubbling rate is adjusted by a pressure difference ΔP=P2−P0, and P0 is a numerical value on the pressure gauge 23.

The temperature of the phosphorus source carrier 11 is adjusted by the thermocouple b22 to obtain the desired bubbling rate and a value of the pressure difference ΔP at this moment. The pressure inside the phosphor source carrier 11 is tested through the pressure measurement system 10. Since a liquid boron oxide column 9 has poor thermal conductivity, the temperature feedback is insensitive. A temperature control system cannot feed back and control the power of the induction coil 1 through the thermocouple 8. The power of the induction coil 1 is fed back through the thermocouple b22, and then the temperature in the phosphorus source carrier 11 is adjusted to adjust the numerical value of the pressure P2; the desired bubbling rate is obtained; and the optimal value of the pressure difference ΔP at this moment is obtained. As the number of phosphorus elements in the phosphorus source carrier 11 decreases, the pressure inside the phosphorus source carrier 11 will decrease. The power of the induction coil 1 is fed back and controlled by the temperature control system and the thermocouple b22 to keep the pressure P2 in the phosphorus source carrier 11 constant.

After the synthesis is completed, the current of the induction coil 1 and the auxiliary heater 21 drops to 0 A. The phosphorus source carrier 11 is lifted up by the lifting mechanism 20 to force the injection pipe 6 to be separated from the boron oxide covering agent 14.

After the furnace is dismantled, the system is vented to 1 atmosphere; the phosphorus source carrier upper cover 11-1 is cut off; and phosphorus source carrier main body 11-2 is cleaned for next use. At the same time, the pressure measurement sealing cap 10-1 is cut off, and the thermocouple a8 is maintained for the next use.

The invention claimed is:

1. A semiconductor phosphide injection synthesis system comprising a furnace body, a shielding carrier box (2) arranged above the furnace body by virtue of a lifting mechanism (20), a phosphorus source carrier (11) arranged in the shielding carrier box (2), an injection pipe (6) arranged below the phosphorus source carrier (11), and a crucible (13) arranged at an inner bottom of the furnace body in a matched manner, wherein the phosphorus source carrier (11) comprises a phosphorus source carrier main body (11-2), a phosphorus source carrier upper cover (11-1), a heating element base (4) arranged at an inner bottom of the phosphorus source carrier main body (11-2), and a heating element (12) arranged on the heating element base (4); a heat insulation layer (7) is wrapped on an outer wall of the phosphorus source carrier (11); and an induction coil (1) is arranged between the heat insulation layer (7) and an inner wall of the shielding carrier box (2).

2. The semiconductor phosphide injection synthesis system according to claim 1, wherein a pressure measurement system is arranged on the phosphorus source carrier upper cover (11-1); the pressure measurement system comprises a pressure-equalizing pipe (10-2) welded to the phosphorus source carrier upper cover (11-1), a solid boron oxide column (17) arranged in the pressure-equalizing pipe (10-2), a pressure measurement sealing cap (10-1) with a thermocouple a (8), and an auxiliary heater (21) arranged on an outer wall of the pressure-equalizing pipe (10-2); the pressure measurement sealing cap (10-1) is welded to an upper end of the pressure-equalizing pipe (10-2); a lower end of the pressure-equalizing pipe (10-2) is provided with an air inlet hole (10-4) communicated with the phosphorus source carrier (11); an observation scale (10-3) is arranged on the pressure-equalizing pipe (10-2); and an upper end surface of the furnace body is provided with an observation window a (18).

3. The semiconductor phosphide injection synthesis system according to claim 2, wherein a thermocouple wire of the thermocouple a (8) is connected to a sensor on an outer side of the furnace body.

4. The semiconductor phosphide injection synthesis system according to claim 1, wherein a bottom of the phosphorus source carrier main body (11-2) is provided with an insertion slot (11-3) for accommodating a thermocouple b (22); the thermocouple b (22) is "⌐"-shaped, an upper end of which is arranged in the insertion slot (11-3) and a left side of which is connected to the furnace body.

5. The semiconductor phosphide injection synthesis system according to claim 1, wherein an outer wall of the crucible (13) is provided with a main resistive heater (15) in a surrounding manner, and an observation window b (19) matched with the crucible (13) is arranged in the middle of the furnace body.

* * * * *